(12) United States Patent
Sumi

(10) Patent No.: US 6,578,261 B2
(45) Date of Patent: Jun. 17, 2003

(54) PART-MOUNTING SYSTEM COMPRISING A PLURALITY OF PART MOUNTING DEVICES AND METHOD OF PART MOUNTING

(75) Inventor: Hideki Sumi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/923,897

(22) Filed: Aug. 7, 2001

(65) Prior Publication Data

US 2002/0073537 A1 Jun. 20, 2002

(30) Foreign Application Priority Data

Aug. 7, 2000 (JP) ........................................ 2000-238935

(51) Int. Cl.[7] ................................................ H05K 3/30
(52) U.S. Cl. .............................. 29/832; 29/593; 29/833; 29/840; 209/573
(58) Field of Search ........................ 29/840, 832, 833, 29/593; 209/573

(56) References Cited

U.S. PATENT DOCUMENTS 3,264,918 A * 8/1966 Lockart
4,348,276 A * 9/1982 Tateishi et al.
4,667,403 A * 5/1987 Edinger et al.

* cited by examiner

*Primary Examiner*—Carl J. Arbes
(74) *Attorney, Agent, or Firm*—RatnerPrestia

(57) ABSTRACT

In a part-mounting system formed by linking plural part-mounting devices which carry out respective process steps of part-mounting, when a production tact-time of one of the devices varies beyond a given variation range, a tact-time change signal is sent to other devices located at upstream and/or downstream of the device via a communicating section. The other devices receive the tact-time change signal and changes their own work tact-times from the ones corresponding to a productivity-oriented mode to a slower tact-pattern corresponding to a quality-oriented mode. Thus every device constituting the system can accommodate a tact-time variation due to a tact-time delay of any part-mounting device. As a result, the quality appropriate to the tact-time can be secured.

18 Claims, 4 Drawing Sheets

PART-MOUNTING SYSTEM COMPRISING A PLURALITY OF PART MOUNTING DEVICES AND METHOD OF PART MOUNTING

FIELD OF THE INVENTION

The present invention relates to a part-mounting system (a part-mounting line), for mounting an electronic part onto a board, comprising a plurality of part-mounting devices, and a method of mounting parts.

BACKGROUND OF THE INVENTION

A part-mounting line for mounting an electronic part onto a board is formed by linking various part-mounting devices such as a screen-printing device, a part-mounting device and the like. In such a part-mounting line, since the respective part-mounting devices are linked to each other, the following point is taken into consideration: A cycle time of the part-mounting line (a total processing time required by the line) is desirably minimized in order to maximize productivity, and cycle times for the respective mounting devices (a process time required by each device, and hereinafter referred to as a "tact time") are prepared considering balances between respective devices.

In general, a tact time of respective devices is often inconsistent with quality of the work in a corresponding device. For instance, in a screen printing device for printing cream solder onto a board, when a printing speed is raised, print defects tend to increase. In a part-mounting device for mounting a part onto a board, when a mounting speed is set at a higher speed, the number of mounting-errors increases. Therefore, when the cycle time of the part-mounting line is prepared, the trade-off between productivity and quality is seriously taken into consideration before the most reasonable cycle time is set.

However, even if the most reasonable cycle time is used, the following problems still occur in an actual production line: Each of the mounting devices sometimes pauses for supplementing the shortage of parts, or due to unexpected defects. These happenings delay the tact time. In such a case, an operation is halted or production is delayed at that mounting device, and yet, this delay inevitably influences other mounting devices in the same line.

In the mounting devices on the downstream side of that problem-happened mounting device, boards are not supplied on schedule based on the tact time. As a result, waiting time is produced, and the device halts its operation during the waiting time. On the upstream side of that problem-happened mounting-device, even if the production is kept going on schedule based on the tact time, boards are piled up just before the problem-happened mounting device. As a result, when a number of boards piled up exceeds a given number, the production is halted, and the waiting time is produced also. Thus the volume produced in the mounting line does not reach the expected volume corresponding to the cycle time prepared before the production starts, which means that the productivity of the line lowers from the expected level. In other words, this situation produces the same result as when slower tact times of each mounting device than those in this case discussed above are used.

When a quality level of the board produced in the delayed tact-time situation is considered, we may get the following result: Each board has undergone the respective mounting devices at the operation speed based on the tact time prepared before the production started, thus each of the boards has obtained a quality level lower than the quality level which would be obtained at a slower tact time. In other words, the mounting-line has produced the boards having the lower quality level than an expected one at a lower productivity than an expected productivity. The expected quality level and productivity are derived from the trade-off between productivity and quality. Thus an opportunity loss has occurred in the production line.

SUMMARY OF THE INVENTION

The present invention provides a part-mounting system formed of a plurality of part-mounting devices, for mounting parts on a board, linked to each other in series. The system comprises the following elements:

(a) a tact-time detecting means for detecting a production tact-time of a first part-mounting device;

(b) signal outputting means for outputting a tact-time change signal to a second part-mounting device disposed on upstream and/or downstream side from the first part-mounting device when the production tact-time detected varies beyond a given variation range; and (c) tact-time setting means for changing a work tact-time of the first part-mounting device after receiving a tact-time change signal supplied from a part-mounting device other than the first part-mounting device.

The present invention provides a first part-mounting device □ an element of a part-mounting system formed by linking a plurality of part-mounting devices □ comprises the following elements:

(a) tact-time detecting means for detecting a production tact-time of the first part-mounting device;

(b) signal outputting means for outputting a tact-time change signal to a second part-mounting-device disposed on upstream and/or downstream side from the first part-mounting device when the production tact-time detected varies beyond a given variation range; and (c) tact-time setting means for changing a work tact-time of the first part-mounting device after receiving a tact-time change signal supplied from any part-mounting device other than the first part-mounting-device.

The present invention provides a method of mounting parts onto a board through linking a plurality of part-mounting devices and having respective devices mount parts on the board. The method comprises the following steps:

(a) detecting a production tact-time of a first part-mounting device;

(b) outputting a tact-time change signal to a second part-mounting device disposed on upstream and/or downstream side from the first part-mounting device when the production tact-time detected varies beyond a given variation range; and (c) changing a work tact-time of the first part-mounting device after receiving a tact-time change signal supplied from any part-mounting device other than the first part-mounting device.

Another method may include, instead of step (c), a step of changing a work tact-time of the second part-mounting device after the tact-time change signal supplied in step (b) is received.

According to the present invention, if a tact-time of one of part-mounting devices is delayed due to an external disturbance, tact-times of other devices included in a mounting line can accommodate themselves to the change of the tact-time, thereby securing the quality appropriate to those tact-times changed.

DETAILED DESCRIPTION OF THE INVENTION

Figure 1:
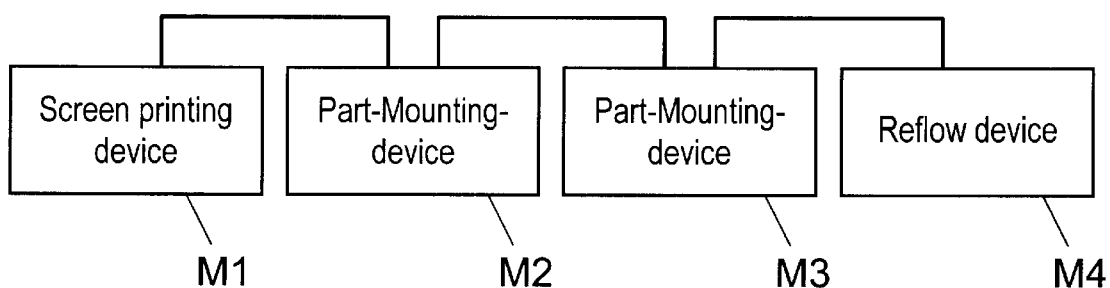
FIG. 1 illustrates a structure of a part-mounting system in accordance with an exemplary embodiment of the present invention.
Figure 2:
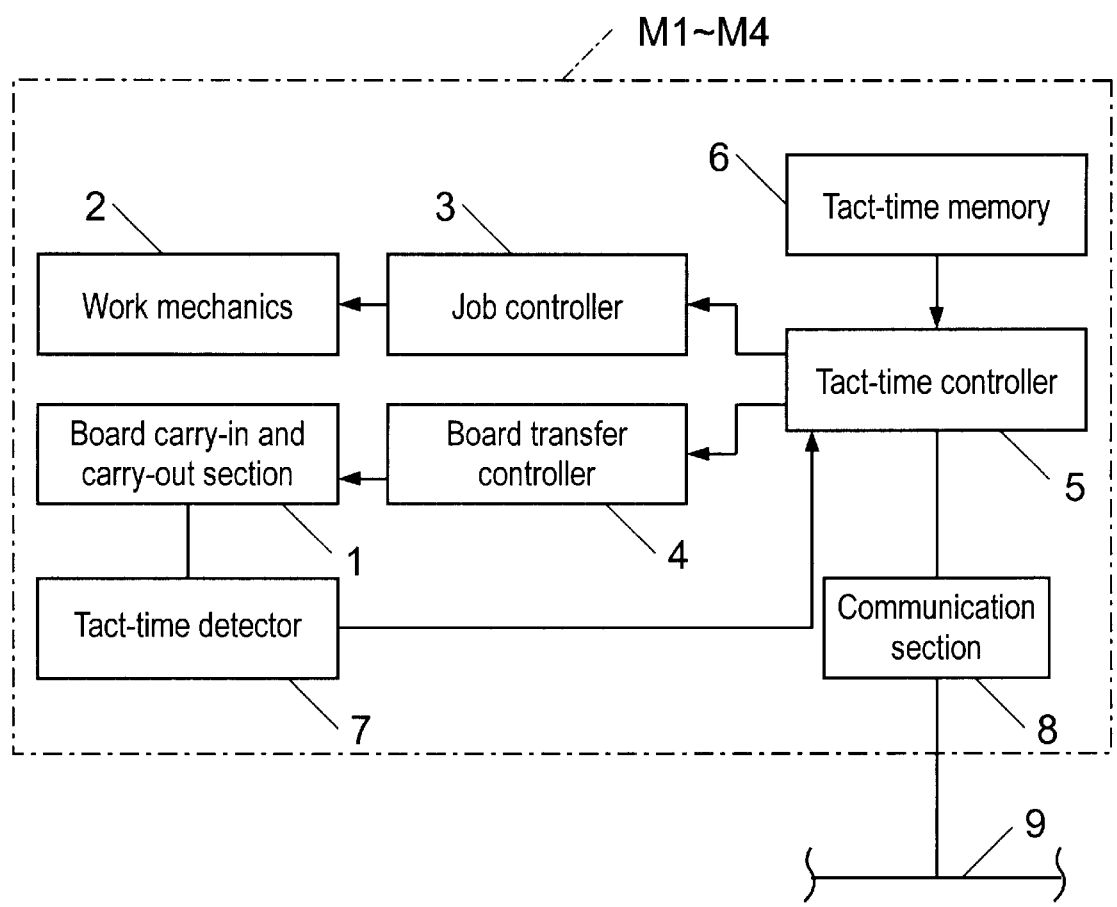
FIG. 2 is a block diagram illustrating a structure of a part-mounting device in accordance with the exemplary embodiment of the present invention.
Figure 3:
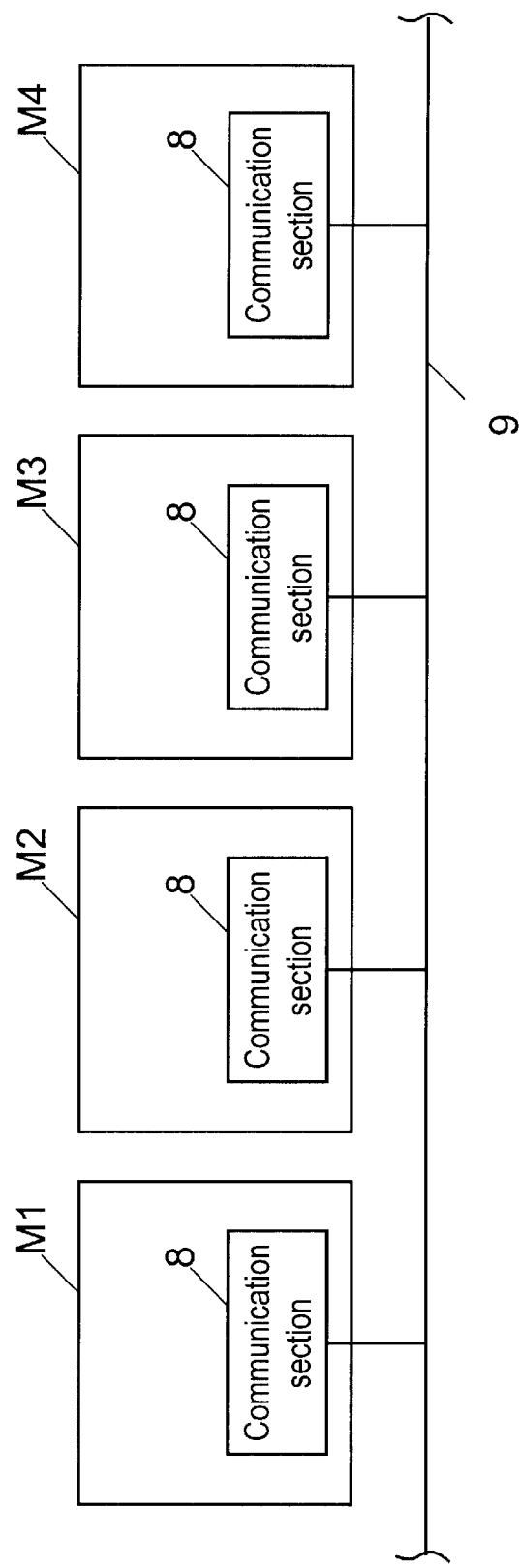
FIG. 3 is a block diagram illustrating a receipt/transmit of a control signal between respective part-mounting devices of the mounting system in accordance with the exemplary embodiment of the present invention.
Figure 4:
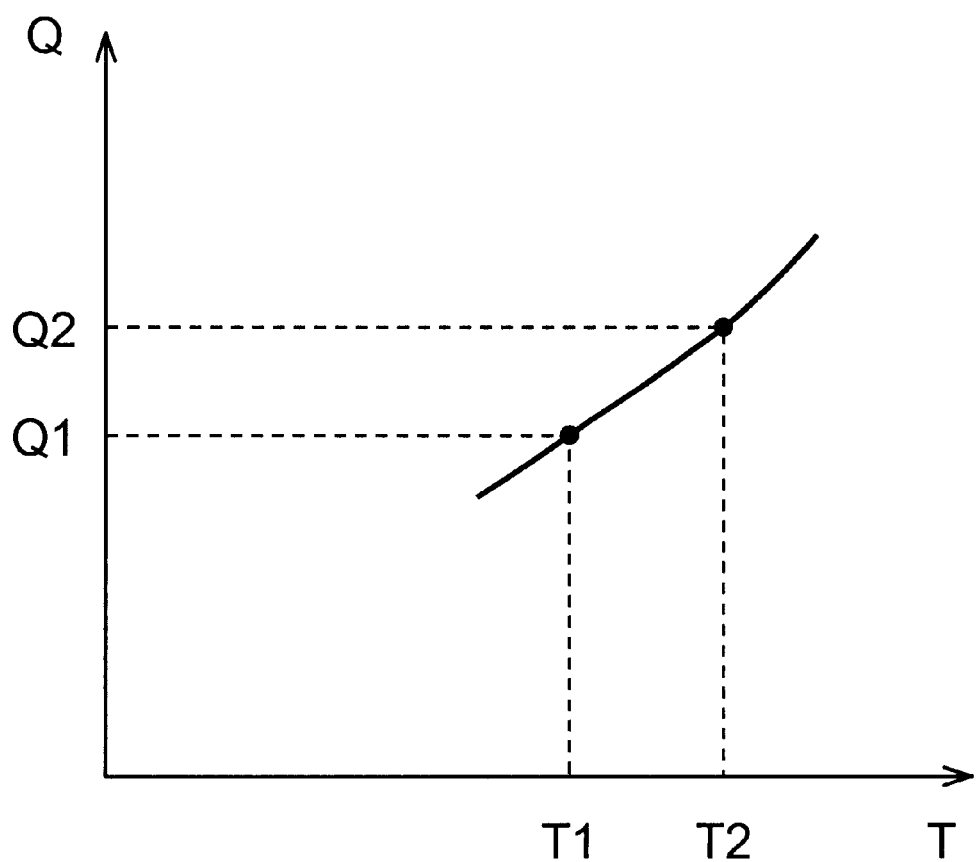
FIG. 4 is a graph illustrating a relative relation between tact-time and quality evaluation in the part-mounting device in accordance with the exemplary embodiment of the present invention.

An exemplary embodiment of the present invention is demonstrated with reference to the accompanying drawings. FIG. 1 illustrates a structure of a part-mounting system. FIG. 2 is a block diagram of a part-mounting device, an element of the part-mounting system shown in FIG. 1. FIG. 3 shows a receipt/transmit of a control signal in the part-mounting system shown in FIG. 1. FIG. 4 is a graph illustrating a relative relation between tact-time and quality evaluation in the part-mounting device.

First, the part-mounting system, i.e., part-mounting line, is described with reference to FIG. 1. In FIG. 1, respective devices marked with M1 through M4 are part-mounting devices constituting the line and in charge of respective process steps of mounting electronic parts onto a board. Screen printing device M1 carries out the first process step of the line, and receives a board from a previous process, i.e., a board-supplying section, located on the upstream side thereof. Printing device M1 prints cream solder, for soldering a part, at a given place on the board received.

The board undergone the printing of cream solder is transferred to part-mounting devices M2 and M3, where a plurality of parts are sequentially mounted thereto. The board with the parts is transferred to reflow-device M4, where the board is heated and the parts are soldered to the board. A part-mounted board is thus completed. The board completed is collected by a board-collecting section (not shown.)

Next, structures of respective devices (M1 through M4) are described with reference to FIG. 2. In FIG. 2, board carry-in and carry-out section 1 carries a board into the device, and positions the board with respect to work mechanics 2 which carries out a job proper to the device, i.e., carrying out the screen-printing or the part-mounting. The job of mechanics 2 is controlled by job controller 3. The job of board carry-in and carry-out section 1 is controlled by board-transfer-controller 4. After respective jobs are done, board carry-in and carry-out section 1 carries the board out to a device on the downstream side.

Job controller 3 and board-transfer-controller 4 are coupled to tact-time controller 5, which prepares work speeds of board carry-in and carry-out section 1 and work-mechanics 2, i.e., work tact-times of the device, based on tact-pattern stored in tact-time memory 6. Tact-time controller 5 is also coupled to communicating section 8 which is, as shown in FIG. 3, coupled to respective communicating sections 8 of other part-mounting devices by on-line means 9.

The tact-time and tact-pattern are described here. In this specification, the tact-time is divided into two categories, i.e., one is a production tact-time and the other is a work tact-time. The production tact-time indicates how much time is spent per board based on the quantity of boards actually produced by the device; to be more specific, the production tact-time is the net work-time spent by the device per board plus the time spent for carrying-in and carrying-out the board. The work tact-time, on the other hand, indicates only work time spent by one device and can be pre-determined by specifying speeds of individual actions and intervals between the actions, where the actions and intervals constitute the job.

The work tact-time has various tact-patterns depending on various production modes, such as a productivity mode aiming at a high productivity and a quality-oriented-mode aiming at a quality-comes-first production. These tact-patterns are stored in tact-time memory 6.

When the device is operated based on a tact-pattern selected, a tact-time calculated based on the actual production result is the production tact-time. In other words, the production tact-time is influenced by every factor in the production process, and varied by not only the status of the device per se but also happenings in other devices.

The production tact-time can be detected by monitoring, with tact-time detector 7 (tact-time detecting means), the board carried in by board carry-in and carry-out section 1 from the upstream side as well as the board undergone the work and carried out to the downstream side. In other words, tact-time detector 7 always detects a carry-in board and a carry-out board with board-detecting means such as an optical sensor, so that the time span between a board arrival at the device from an upstream device and a board delivery to a downstream device is clocked. The production tact-time of the device is thus detected.

The production tact-time detected is sent to tact-time controller 5, which detects a variation of a tact-time and determines whether or not other tact-times must be changed. When the production tact-time detected varies beyond a given variation range, tact-time controller 5 outputs a tact-time change signal, via communicating section 8, to another part-mounting-device (a second part-mounting device) located on downstream side or upstream side of the device (a first part-mounting device.)

In other words, when the production tact-time detected at the first part-mounting-device varies beyond the given variation range, the variation is detected by tact-time controller 5. The detection result is sent, as a tact-time change signal, to tact-time controller 5 of the second part-mounting device via communicating section 8. As such, controller 5 and communicating section 8 function as signal-outputting means for outputting a tact-time change signal.

The second part-mounting-device receives the tact-time change signal, then the following process is taken place: Receiving the tact-time change signal via communicating section 8, tact-time controller 5 of the second part-mounting device reads out a tact-pattern corresponding to the change signal from memory 6, and prepares new work tact-times for work controllers 3 and board transfer controller 4. In other words, controller 5 of the second device receives the tact-time change signal from the first device and functions as tact-time setting means for changing a work tact-time of the second device. As such, when a production tact-time of a device is delayed, other devices operate based on work tact-times accommodating the delayed status.

A typical example of a variation of the production tact-time can be seen when a device pauses due to a machine trouble. This pause results in no board delivery from the device. Thus a substantial delay in the production tact-time is detected. In another example, when some of part-adhesion nozzles of a part-mounting device become defect, the production decreases according to a ratio of the defective nozzles, which delays the production tact-time.

Relation between a work tact-time and production quality is described with reference to FIG. 4, which shows the relation between the work tact-time T (X-axis) and quality evaluation Q (Y-axis.) As shown in FIG. 4, the quality evaluation decreases at shorter work tact-times. In other words, an incidence of defects increases at a higher work speed of a work mechanics of a device. For instance, in a screen printing, when a squeegeeing speed is excessively raised, a stable printing cannot be expected, and print quality lowers.

In a part-mounting, when a work speed of a transfer head is raised excessively or a stabilizing-time required at a given timing is omitted, parts cannot be transferred exactly in a stable manner, which results in lowering mounting quality. As such, shortening a work tact-time for aiming at high productivity is contrary to stabilizing respective works for aiming at high quality. Therefore, when a tact-time is prepared, the trade-off between productivity and quality is desirably taken into account on a reasonable basis.

When a part-mounting device is in operation, various factors would cause its production tact-time not to keep staying. Thus a given work tact-time T1 of a device cannot be maintained any more, and the device is only able to work at a slower work tact-time T2. In such a case, devices other than the defective device conventionally work according to given work tact-time T1. As a result, the average quality of the boards produced at any devices has reached quality evaluation Q1 corresponding to work tact-time T1.

However, from a productivity view of point, the actual production quantity is no more than the quantity gained when all the devices operate at work tact-time T2, and it cannot meet the quantity expected before the production starts. If all the devices operated at work tact-time T2, the average quality would meet quality evaluation Q2 which is higher than Q1; however, the actual quality only reaches Q1 due to the opportunity loss.

The present invention aims to overcome such an unreasonable matter, and changes a tact-pattern of the other devices to a predetermined slower tact-pattern when a production tact-time of a device varies beyond a given variation range. In other words, when a production tact-time is delayed inevitably, the tact-pattern is changed to the one corresponding to quality-oriented mode.

This mechanism allows the production line to continue mounting parts following the tact-pattern corresponding to a productivity-oriented-mode. On the other hand, this mechanism eliminates an unreasonable matter of producing an opportunity loss in the production line because waiting time emerges due to influence from a delayed production tact-time of another device.

As discussed above, according to the present invention, a production tact-time of one of part-mounting devices constituting a part-mounting system is detected. When the production tact-time detected varies beyond a given variation range, a tact-time change signal is supplied to the other part-mounting devices disposed on the downstream side or upstream side thereof. The other devices receive this change signal and change their own work tact-times. Thus when a tact-time of any device is delayed by some external disturbance, respective tact-times of the other devices accommodate this tact-time variation. As a result, the quality appropriate to the tact-time can be secured.

What is claimed is:

1. A part-mounting system formed by linking a plurality of part-mounting devices for mounting parts onto a board, said system comprising:

(a) tact-time detecting means for detecting a production tact-time of a first part-mounting device;

(b) signal outputting means for outputting a tact-time change signal to a second part-mounting device disposed on at least one of downstream side and upstream side from the first part-mounting device when the production tact-time detected varies beyond a given variation range; and (c) tact-time setting means for receiving the tact-time change signal supplied from a part-mounting device other than the first part-mounting device and changing a work tact-time of the first part-mounting device.

2. The part-mounting system of claim 1, wherein said tact-time detecting means includes board-detecting means for always detecting an arrival board at the first part-mounting device from upstream and a delivery board to downstream.

3. The part-mounting system of claim 1, wherein the work tact-time has tact-patterns corresponding to a productivity-mode aiming at high productivity and a quality-oriented mode aiming at high quality.

4. The part-mounting system of claim 3, further comprising a tact-time memory for storing the tact-patterns.

5. A first part-mounting device of a part-mounting system which is formed by linking a plurality of part-mounting devices, said first part-mounting device comprising:

(a) tact-time detecting means for detecting a production tact-time of said first part-mounting device;

(b) signal outputting means for outputting a tact-time change signal to a second part-mounting device disposed on at least one of downstream side and upstream side from the first part-mounting device when the production tact-time detected varies beyond a given variation range; and (c) tact-time setting means for receiving the tact-time change signal supplied from a part-mounting device other than said first part-mounting device and changing a work tact-time of said first part-mounting device.

6. The first part-mounting device of claim 5, wherein said tact-time detecting means includes board-detecting means for always detecting an arrival board at said first part-mounting device from upstream and a delivery board to downstream.

7. The first part-mounting device of claim 5, wherein the work tact-time has tact-patterns corresponding to a productivity-mode aiming at high productivity and a quality-oriented mode aiming at high quality.

8. The first part-mounting device of claim 7, further comprising a tact-time memory for storing the tact-patterns.

9. A method of mounting a part on a board by linking a plurality of part-mounting devices and having the respective devices carry out respective process steps of part-mounting, said method comprising the steps of:

(a) detecting a production tact-time of a first part-mounting device;

(b) outputting a tact-time change signal to a second part-mounting device disposed on at least one of downstream side and upstream side from the first part-mounting device when the production tact-time detected varies beyond a given variation range; and (c) receiving the tact-time change signal supplied from a part-mounting device other than the first part-mounting device and changing a work tact-time of the first part-mounting device.

10. The method of claim 9, wherein the production tact-time is detected by clocking a time span between a board arrival from an upstream device and a board delivery to a downstream device.

11. The method of claim 9, wherein the work tact-time has tact-patterns corresponding to a productivity-mode aiming at high productivity and a quality-oriented mode aiming at high quality.

12. The method of claim 11, wherein the tact-patterns are stored in a tact-time memory.

13. The method of claim 11, wherein when a delay is detected in the production tact-time, a tact-pattern corresponding to the productivity mode is changed to another tact-pattern corresponding to the quality-oriented mode in the work tact-time.

14. A method of mounting a part on a board by linking a plurality of part-mounting devices and having the respective devices carry out respective process steps of part-mounting, said method comprising the steps of:

(a) detecting a production tact-time of a first part-mounting device;

(b) outputting a tact-time change signal to a second part-mounting device disposed on at least one of downstream side and upstream side from the first part-mounting device when the production tact-time detected varies beyond a given variation range; and (c) receiving the tact-time change signal and changing the work tact-time in the second part-mounting device.

15. The method of claim 14, wherein the production tact-time is detected by clocking a time span between a board arrival from an upstream device and a board delivery to a downstream device.

16. The method of claim 14, wherein the work tact-time has tact-patterns corresponding to a productivity-mode aiming at high productivity and a quality-oriented mode aiming at high quality.

17. The method of claim 16, wherein the tact-patterns are stored in a tact-time memory.

18. The method of claim 16, wherein when a delay is detected in the production tact-time, a tact-pattern corresponding to the productivity mode is changed to another tact-pattern corresponding to the quality-oriented mode in the work tact-time.

* * * * *